(12) United States Patent
Iwabuchi et al.

(10) Patent No.: US 10,913,124 B2
(45) Date of Patent: Feb. 9, 2021

(54) POWER SUPPLY CONTROL APPARATUS OF ELECTRIC DISCHARGE MACHINE

(71) Applicant: Mitsubishi Electric Corporation, Tokyo (JP)

(72) Inventors: Yuki Iwabuchi, Tokyo (JP); Kazunari Morita, Tokyo (JP); Hiroki Hikosaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/349,628

(22) PCT Filed: Apr. 11, 2017

(86) PCT No.: PCT/JP2017/014824
§ 371 (c)(1),
(2) Date: May 14, 2019

(87) PCT Pub. No.: WO2018/189809
PCT Pub. Date: Oct. 18, 2018

(65) Prior Publication Data
US 2019/0270151 A1 Sep. 5, 2019

(51) Int. Cl.
*B23H 1/02* (2006.01)
*G01R 19/165* (2006.01)
*H03K 5/24* (2006.01)

(52) U.S. Cl.
CPC .............. *B23H 1/024* (2013.01); *B23H 1/02* (2013.01); *G01R 19/165* (2013.01); *H03K 5/24* (2013.01)

(58) Field of Classification Search
None
See application file for complete search history.

(56) References Cited

U.S. PATENT DOCUMENTS 3,864,541 A * 2/1975 Inoue .................. B23H 1/022
219/69.13
3,997,753 A * 12/1976 Inoue .................. B23H 1/022
219/69.13
(Continued)

FOREIGN PATENT DOCUMENTS

JP 3-55123 A 3/1991
JP 7-256514 A 10/1995
(Continued)

OTHER PUBLICATIONS

International Search Report and Written Opinion dated May 23, 2017 for PCT/JP2017/014824 filed on Apr. 11, 2017, 9 pages including Translation of the International Search Report.
(Continued)

*Primary Examiner* — Ibrahime A Abraham
*Assistant Examiner* — Gyounghyun Bae
(74) *Attorney, Agent, or Firm* — Xsensus LLP

(57) ABSTRACT

The present invention is a power supply control apparatus that controls pulse discharge occurring in a machining gap in an electric discharge machine. The power supply control apparatus includes: a voltage level detecting device that detects the voltage level of a discharge voltage generated in the machining gap; a voltage level comparator hat compares the voltage level with a voltage level reference value, and outputs a comparison result; and a determining unit that, on the basis of the comparison result, determines whether a discharge pulse is abnormal in a designated one of a plurality of determination modes. The determination method can be designated during machining.

15 Claims, 7 Drawing Sheets

(56) References Cited

U.S. PATENT DOCUMENTS

| | | | | |
|---|---|---|---|---|
| 3,999,028 A * | 12/1976 | Saito | ............... | B23H 1/022 |
| | | | | 219/69.17 |
| 4,800,248 A * | 1/1989 | Futamura | ............... | B23H 1/022 |
| | | | | 219/69.18 |
| 5,399,826 A * | 3/1995 | Kaneko | ............... | B23H 1/02 |
| | | | | 219/69.13 |
| 5,496,984 A * | 3/1996 | Goto | ............... | B23H 1/024 |
| | | | | 219/69.13 |
| 6,208,150 B1 * | 3/2001 | Akamatsu | ............... | B23H 1/024 |
| | | | | 324/678 |
| 6,278,075 B1 * | 8/2001 | Kamiguchi | ............... | B23H 7/04 |
| | | | | 219/69.12 |
| 8,134,096 B2 * | 3/2012 | Ukai | ............... | B23H 1/024 |
| | | | | 219/69.13 |
| 8,323,473 B2 * | 12/2012 | Luo | ............... | B23H 7/16 |
| | | | | 205/640 |
| 8,415,581 B2 | 4/2013 | Ukai et al. | | |
| 8,420,973 B2 * | 4/2013 | Ukai | ............... | B23H 1/024 |
| | | | | 219/69.13 |
| 9,446,465 B2 * | 9/2016 | Sasaki | ............... | B23H 1/022 |
| 9,486,869 B2 * | 11/2016 | Murai | ............... | B23H 1/024 |
| 9,718,140 B2 * | 8/2017 | Onodera | ............... | B23H 1/024 |
| 9,833,853 B2 * | 12/2017 | Furuta | ............... | B23H 7/18 |
| 9,950,378 B2 * | 4/2018 | Furuta | ............... | B23H 1/02 |
| 10,259,062 B2 * | 4/2019 | Tee | ............... | B23H 7/12 |
| 2004/0222195 A1 * | 11/2004 | Boccadoro | ............... | B23H 1/022 |
| | | | | 219/69.13 |

FOREIGN PATENT DOCUMENTS

| | | | | |
|---|---|---|---|---|
| JP | | 5264789 B2 | 8/2013 | |
| WO | WO-2014087457 A1 * | | 6/2014 | ............ B23H 1/024 |

OTHER PUBLICATIONS

Notification of Reasons for Refusal received for Japanese Patent Application No. 2017-562375, dated Feb. 13, 2018, 5 pages including English Translation.

Decision to Grant a Patent received for Japanese Patent Application No. 2017-562375, dated Jul. 10, 2018, 4 pages including English Translation.

* cited by examiner

POWER SUPPLY CONTROL APPARATUS OF ELECTRIC DISCHARGE MACHINE

CROSS-REFERENCE TO RELATED APPLICATION

The present application is based on PCT filing PCT/JP2017/014824 filed Apr. 11, 2017, the entire contents of which are incorporated herein by reference.

FIELD

The present invention relates to a power supply control apparatus for controlling a machining power supply of an electric discharge machine for causing discharge between a machining electrode and a workpiece, using the machining power supply.

BACKGROUND

An electric discharge machine performs discharge machining on a workpiece by repeatedly causing pulse discharge, which is pulse-like short-period discharge, in a machining gap between a machining electrode and the workpiece disposed in a face-to-face relation to each other. The electric discharge machine includes a machining power supply that applies a machining voltage, which is a voltage for performing machining, to the machining gap. The machining power supply is controlled by a power supply control apparatus. For example, the power supply control apparatus controls the discharge pulse width, that is, the discharge time width of pulse discharge to be caused in the machining gap, and a suspension time that is a period during which no machining voltage is applied.

In an electric discharge machine, abnormal discharge called arc discharge sometimes occurs, and the occurrence of this abnormal discharge is found as a decrease in the discharge voltage. Continuance of an abnormal discharge state may cause problems such as abnormal wear of an electrode and appearance of protrusions. To address such problems, a power supply control apparatus of an electric discharge machine is required to have a function of controlling the discharge time width, the suspension time, and the like, to reduce the abnormal discharge.

For example, Patent Literature 1 discloses that when the discharge voltage becomes lower than a reference voltage, the discharge time width is reduced to reduce the abnormal discharge. Patent Literature 1 also discloses that whether a discharge pulse is a normal pulse or an abnormal pulse is determined on the basis of the discharge voltage and the high-frequency component of the discharge voltage. On the basis of the number of the determinations in succession that the discharge pulse is the abnormal pulse and the number of the determinations in succession that the discharge pulse is the normal pulse, the suspension time is changed.

CITATION LIST

Patent Literature

Patent Literature 1: Japanese Patent No. 5264789

SUMMARY

Technical Problem

For the technique disclosed in Patent Literature 1, the reference value to be used in determining whether the discharge pulse is the normal pulse or the abnormal pulse is a constant value, and the reference value might not be appropriate depending on the machining state. For example, the technique disclosed in Patent Literature 1 may decrease the machining speed because the suspension time is extended more than necessary when the number of times the discharge pulse is determined to be the abnormal pulse becomes larger than necessary due to the inappropriate the reference value is not appropriate.

The present invention has been made in view of the above, and aims to provide a power supply control apparatus of an electric discharge machine, the power supply control apparatus being capable of reducing abnormal discharge as well as reducing a decrease in the machining speed.

Solution to Problem

To solve the above problem and achieve the object, the present invention provides a power supply control apparatus of an electric discharge machine, the power supply control apparatus controlling pulse discharge occurring in a machining gap in the electric discharge machine. The power supply control apparatus comprises: a voltage level detecting unit to detect a voltage level of a discharge voltage generated in the machining gap; and a voltage level comparator to compare the voltage level with a voltage level reference value, and output a comparison result. The apparatus also comprises a determining unit to, on a basis of the comparison result, determine whether a discharge pulse is abnormal, in a designated one of a plurality of determination modes. The power supply control apparatus of the present invention provides the determination mode that is capable of being designated during machining.

Advantageous Effects of Invention

The power supply control apparatus of the electric discharge machine according to the present invention has an effect of reducing the abnormal discharge as well as reducing the decrease in the machining speed.

DESCRIPTION OF EMBODIMENTS

Power supply control apparatuses of electric discharge machines according to embodiments of the present invention are described in detail below with reference to the drawings. It should be noted that the present invention is not limited to these embodiments.

First Embodiment

Figure 1:
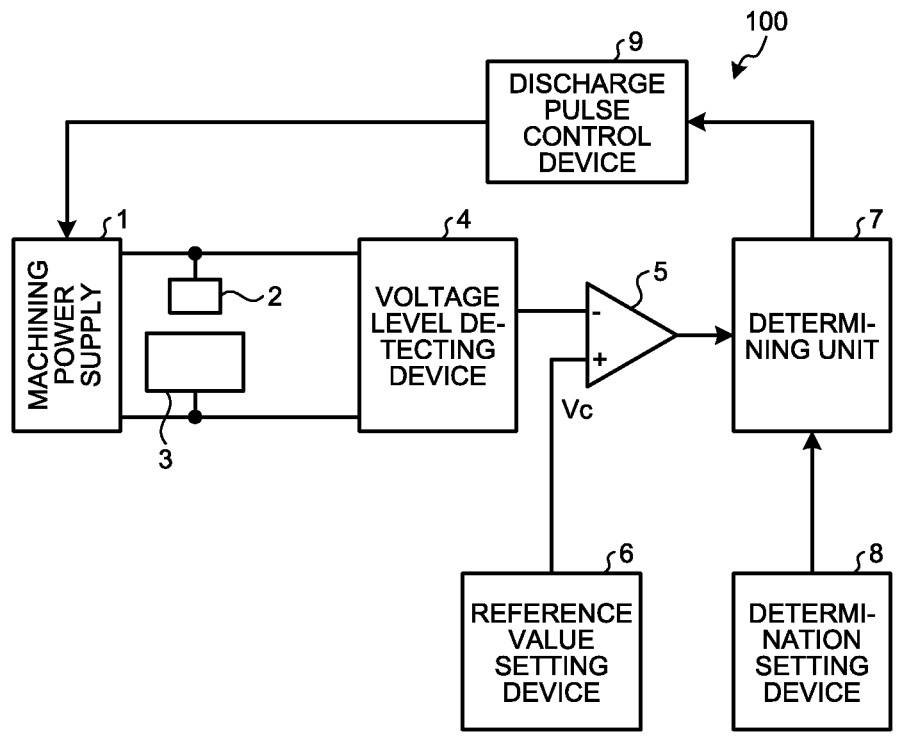
FIG. 1 is a diagram illustrating an example configuration of a power supply control apparatus of an electric discharge machine according to a first embodiment.

FIG. 1 is a diagram illustrating an example configuration of a power supply control apparatus of an electric discharge machine according to a first embodiment of the present invention. The power supply control apparatus 100 illustrated in FIG. 1 is a power supply control apparatus of an electric discharge machine according to the present invention, and controls a machining power supply 1 of the electric discharge machine. The electric discharge machine includes the machining power supply 1, a machining electrode 2, and the power supply control apparatus 100. The electric discharge machine of the present embodiment is, for example, a carving electric discharge machine. The electric discharge machine machines a workpiece 3 by causing pulse discharge in a machining gap between the machining electrode 2 and the workpiece 3. The power supply control apparatus 100 controls the pulse discharge caused in the machining gap in the electric discharge machine. The workpiece 3 is a conductor that allows occurrence of the pulse discharge in the machining gap.

The power supply control apparatus 100 controls the machining power supply 1. Under the control of the power supply control apparatus 100, the machining power supply 1 applies a machining voltage to the machining electrode 2 and the workpiece 3 such that pulse discharge, which is discharge having a prescribed pulse width, occurs in the machining gap. After the power supply control apparatus 100 starts the application of the machining voltage, machining discharge is started. In the present embodiment, the time corresponding to the prescribed pulse width is referred to as the machining discharge time. After the machining discharge is performed during the machining discharge time, the power supply control apparatus 100 suspends the machining discharge. Upon a lapse of a predetermined suspension time, then, the power supply control apparatus 100 resumes the application of the machining voltage. Repeating the machining discharge machines the workpiece 3. However, as described later, the power supply control apparatus 100 cuts or shuts off the discharge pulse in a case where the discharge pulse is determined to be an abnormal pulse in the middle of the machining discharge time. As a result of the discharge pulse being shut off, the pulse width of the discharge pulse becomes smaller than the prescribed pulse width.

The power supply control apparatus 100 includes a voltage level detecting device 4, a voltage level comparator 5, a reference value setting device 6, a determining unit 7, a determination setting device 8, and a discharge pulse control device 9.

The voltage level detecting device 4 is a voltage level detecting unit that detects the voltage level of the discharge voltage generated in the machining gap. The reference value setting device 6 outputs a reference voltage $V_C$, which is a voltage of a reference voltage level with respect to the discharge voltage level. The inverting input terminal of the voltage level comparator 5, which is the input terminal denoted by "−" in FIG. 1, is connected to the output terminal of the voltage level detecting device 4. The non-inverting input terminal of the voltage level comparator 5, which is the input terminal denoted by "+" in FIG. 1, is connected to the reference value setting device 6. Thus, the discharge voltage level detected by the voltage level detecting device 4 is input to the inverting input terminal of the voltage level comparator 5, and the reference voltage $V_C$ output from the reference value setting device 6 is input to the non-inverting input terminal of the voltage level comparator 5. As a result, the voltage level comparator 5 compares the voltage level detected by the voltage level detecting device 4 with the voltage level reference value, and outputs a result of the comparison.

Specifically, in a case where the discharge voltage level output from the voltage level detecting device 4 is higher than the reference voltage $V_C$, the voltage level comparator 5 outputs a signal of L (Low) level, which is a signal indicating that the voltage level is normal. In a case where the discharge voltage level output from the voltage level detecting device 4 is lower than the reference voltage $V_C$, on the other hand, the voltage level comparator 5 outputs a signal of H (High) level, which is a signal indicating that the voltage level is abnormal. The signal output from the voltage level comparator 5 is input to the determining unit 7. Although the example discussed herein is based on the assumption that the L level is normal and the H level is abnormal, the logic of normal and abnormal may be reversed to set the L level as abnormal and the H level as normal.

In a case where the discharge voltage level output from the voltage level detecting device 4 becomes lower than the reference voltage $V_C$ during the discharge time, the voltage level comparator 5 switches from L level to H level at the point of time when the discharge voltage level becomes lower than the reference voltage $V_C$. By doing so, the voltage level comparator 5 can notify the determining unit 7 of the abnormality of the voltage level, before the end of the discharge time of one discharge pulse.

The determining unit 7 determines whether the discharge pulse is a normal pulse on the basis of the signal input from the voltage level comparator 5. In a case where the determining unit 7 receives the later described setting information from the determination setting device 8, the determining unit 7 sets determination-related parameters on the basis of the setting information. The determining unit 7 can make determination in the two modes: a mode A and a mode B. In the mode A that is a first mode, the discharge pulse is determined to be an abnormal pulse and is shut off in a case where the cumulative time during which the discharge voltage level is lower than the reference voltage $V_C$ is equal to or longer than a reference determination time $T_R$. In the mode B that is a second mode, the discharge pulse is determined to be an abnormal pulse once the discharge voltage level becomes lower than the reference voltage $V_C$. The discharge pulse is shut off after a delay time $T_d$ has elapsed since the discharge pulse was determined to be the abnormal pulse. The initial values of the information for designating a determination mode, the reference determination time $T_R$, and the delay time $T_d$ may be set beforehand in the determining unit 7, or the determination setting device 8 may receive inputs of these initial values.

When the mode A is designated, the determining unit 7 performs the following operation. The determining unit 7 calculates the cumulative time during which the signal input from the voltage level comparator 5 is the H level signal. On the basis of the calculated cumulative time and the reference determination time $T_R$ input from the determination setting device 8, the determining unit 7 then determines whether the discharge pulse is a normal pulse. Specifically, the signal output from the voltage level comparator 5 is input at regular intervals to the determining unit 7. The determining unit 7 repeats the operation: when a signal of H level is input from the voltage level comparator 5 to the determining unit 7, the determining unit 7 increases the cumulative time; and when a signal of L level is input from the voltage level comparator 5 to the determining unit 7, the determining unit 7 does not increase the cumulative time. The determining unit 7 compares a length of the cumulative time with a length of the reference determination time $T_R$. In a case where the cumulative time is shorter than the reference determination time $T_R$, the determining unit 7 determines that the discharge pulse generated in the machining gap is a normal pulse. In a case where the cumulative time reaches the reference determination time $T_R$, the determining unit 7 determines that the discharge pulse generated in the machining gap is an abnormal pulse, and resets the cumulative time to 0. The determining unit 7 then outputs, to the discharge pulse control device 9, a signal indicating the determination result. The determining unit 7 also resets the cumulative time to 0 when a predetermined machining discharge time has elapsed since the start of the machining discharge.

When the mode B is designated, the determining unit 7 performs the following operation. While the signal input from the voltage level comparator 5 is the L level signal, the determining unit 7 determines the discharge pulse to be a normal pulse, and outputs, to the discharge pulse control device 9, a signal indicating the determination result. When the signal input from the voltage level comparator 5 switches to the H level signal, the determining unit 7 determines the discharge pulse to be an abnormal pulse. After the delay time $T_d$ has elapsed since the determination that the discharge pulse was the abnormal pulse, the determining unit 7 outputs, to the discharge pulse control device 9, the determination result indicating that the discharge pulse is the abnormal pulse.

As described above, on the basis of a result of comparison supplied from the voltage level comparator 5, the determining unit 7 determines whether the discharge pulse is abnormal in a designated one of a plurality of determination modes. In the present embodiment, it is also possible to designate a determination mode prior to machining, or during machining. The plurality of determination modes includes the first determination mode for determining whether the discharge pulse is abnormal, on the basis of: the cumulative time during which the voltage level is lower than the voltage level reference value; and the comparison result supplied from the voltage level comparator 5. The plurality of determination modes also includes the second determination mode for shutting off the discharge pulse after a lapse of the delay time after the voltage level becomes lower than the voltage level reference value on the basis of the comparison result.

The determination setting device 8 is capable of receiving an input of the setting information indicating the parameters related to discharge abnormality determination at the determining unit 7. When receiving an input of the setting information, the determination setting device 8 outputs the received setting information to the determining unit 7. In other words, the determination setting device 8 is a determination setting unit that receives an input designating a determination mode and sets the received determination mode in the determining unit 7. The setting information includes at least one of the information for designating a determination mode, the reference determination time $T_R$, and the delay time $T_d$. In the present embodiment, the determining unit 7 can make determination in the two modes: the mode A and the mode B, as described later. The information for designating the determination mode is information indicating which one of these two modes is to be designated. The reference determination time $T_R$ is a parameter to be used in the determination at the determining unit 7 in a case where the mode A is designated. The delay time $T_d$ is a parameter to be used in the determination at the determining unit 7 in a case where the mode B is designated. The reference determination time $T_R$ and the delay time $T_d$ will be described later in detail.

The discharge pulse control device 9 controls the machining power supply 1 so that a discharge pulse is generated on the basis of a predetermined machining discharge time and a suspension time. The discharge pulse control device 9 shuts off the discharge pulse when a signal indicating that the discharge pulse is determined to be an abnormal pulse is input from the determining unit 7 to the discharge pulse control device 9. Specifically, the discharge pulse control device 9 shuts off the discharge pulse by, for example, controlling the machining power supply 1 such that the machining power supply 1 stops applying the machining voltage. Alternatively, the discharge pulse control device 9 may shut off the discharge pulse by physically increasing the distance between the machining electrode and the workpiece to the insulation distance while applying the machining voltage. The method for shutting off the discharge pulse is not necessarily the above described example method.

Figure 2:
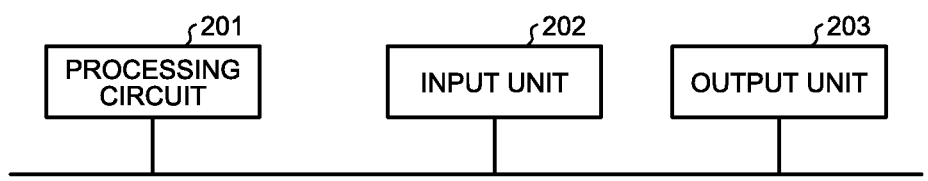
FIG. 2 is a diagram illustrating an example hardware configuration of the power supply control apparatus according to the first embodiment.

Next, a description is made as to the hardware configuration of the power supply control apparatus 100 according to the present embodiment. FIG. 2 is a diagram illustrating an example hardware configuration of the power supply control apparatus 100 according to the present embodiment. As illustrated in FIG. 2, the power supply control apparatus 100 includes a processing circuit 201, an input unit 202, and an output unit 203. The input unit 202 is a unit that receives inputs from the user, such as a keyboard and a mouse. The output unit 203 is a unit for displaying a screen, such as a monitor or a display. The input unit 202 and the output unit 203 may be integrally formed as a touch panel or the like. Note that an example configuration in which the power supply control apparatus 100 can receive inputs directly from the user is described herein, but the power supply control apparatus 100 may be designed to acquire information that an external device has received from the user. In such a case, the input unit 202 is a circuit that receives information from the external device, and the output unit 203 is a circuit that transmits information to the external device. Although one processing circuit 201 is illustrated in FIG. 2, a plurality of processing circuits 201 may be included.

The determination setting device 8 illustrated in FIG. 1 is implemented by the processing circuit 201, the input unit 202, and the output unit 203. In a case where the determination setting device 8 receives an input from the user, a screen that prompts an input is displayed on the output unit 203, and an input is received by the input unit 202.

The voltage level detecting device 4, the voltage level comparator 5, the determining unit 7, and the discharge pulse control device 9 illustrated in FIG. 1 are implemented by the processing circuit 201. The processing circuit 201 may be a digital circuit or an analog circuit. The processing circuit 201 that implements the voltage level detecting device 4 is a voltage detecting circuit, and the reference value setting device 6 is a voltage generating circuit that outputs the voltage of the reference voltage $V_C$. Meanwhile, the processing circuit 201 that implements part of the determination setting device 8, the voltage level detecting device 4, the voltage level comparator 5, the determining unit 7, and the discharge pulse control device 9 may be a processing circuit installed as dedicated hardware, or a circuit including a processor. The processing circuit installed as dedicated hardware is application specific integrated circuits (ASIC), a field programmable gate array (FPGA), or a combination thereof, for example.

Figure 3:
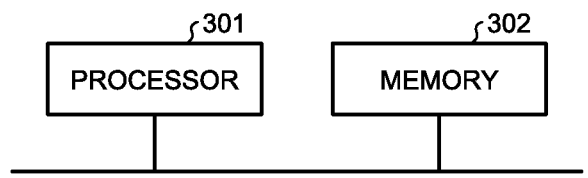
FIG. 3 is a diagram illustrating an example configuration of a processing circuit including a processor according to the first embodiment.

In a case where the processing circuit 201 that implements part of the determination setting device 8, the voltage level detecting device 4, the voltage level comparator 5, the determining unit 7, and the discharge pulse control device 9 is a circuit including a processor, this processing circuit 201 is a circuit having a configuration illustrated in FIG. 3, for example. FIG. 3 is a diagram illustrating an example configuration of the processing circuit 201 including a processor. The processing circuit 201 including a processor includes a processor 301 such as a central processing unit (CPU), and a memory 302. The processor 301 is a CPU, a microprocessor, or the like. The memory 302 is a nonvolatile or volatile semiconductor memory such as a random access memory (RAM), a read only memory (ROM), or a flash memory, a magnetic disk, or the like, for example.

In a case where the processing circuit 201 is implemented by the configuration illustrated in FIG. 3, a program for implementing the functions of part of the determination setting device 8, the voltage level detecting device 4, the voltage level comparator 5, the determining unit 7, and the discharge pulse control device 9 is executed by the processor 301 to thereby provide the processing circuit 201. The memory 302 is also used as a storage area when the program is executed by the processor 301. Alternatively, part of the determination setting device 8, the voltage level detecting device 4, the voltage level comparator 5, the determining unit 7, and the discharge pulse control device 9 may be implemented by a processing circuit that is in part is dedicated hardware, and the remaining components may be implemented by the processing circuit 201 illustrated in FIG. 3 described above.

Next, operation according to the present embodiment is described in comparison with a comparative example in which the discharge pulse is immediately shut off as soon as the voltage level comparator 5 outputs a signal indicating abnormality. For the comparative example, it is difficult to accurately identify a decrease in the discharge voltage level due to instantaneous voltage pulsation, and a decrease in the discharge voltage level due to abnormal discharge. For this reason, in the comparative example, a discharge pulse is shut off due to the instantaneous voltage pulsation. This results in a decrease in the machining speed.

In the first embodiment, in a case where the determination in the mode A is designated, the discharge pulse is shut off when the cumulative time during which the discharge voltage level is lower than the reference voltage $V_C$ is equal to or longer than the reference determination time $T_R$. As a result, the discharge pulse is not shut off when the discharge voltage level decreases due to the instantaneous voltage pulsation. It is thus possible to prevent a decrease in the machining speed while eliminating or reducing the influence of abnormal discharge. Furthermore, as the reference determination time $T_R$ is not a constant value but is variable, it is possible to appropriately identify a decrease in the discharge voltage level and the instantaneous voltage pulsation in accordance with the characteristics of the electric discharge machine, the machining conditions, and the like. The machining conditions are parameters that affect machining results such as the machining time and electrode wear, and are parameters that can be set by the user as desired. For example, the machining conditions are an applied voltage value, a pulse width, a suspension time, and the like.

Further, in the first embodiment, in a case where the determination in the mode B is designated, the discharge pulse is shut off after a lapse of the delay time $T_d$ since the voltage level comparator 5 output a signal indicating abnormality. This makes it possible to prevent a decrease in the machining speed while eliminating or reducing the influence of abnormal discharge. Furthermore, as the delay time $T_d$ is not a constant value but is variable, balance between the elimination of or the reduction in the influence of abnormal discharge and the elimination of or the reduction in decreases in the machining speed can be appropriately adjusted in accordance with the characteristics of the electric discharge machine, the machining conditions, and the like.

Further, in the present embodiment, one of the two modes, the mode A and the mode B, can be designated as the determination mode to be used. As the determination mode is selected in accordance with the characteristics of the electric discharge machine, the machining conditions, and the like, it is possible to more appropriately adjust the balance between the elimination of or the reduction in influence of abnormal discharge and the elimination of or the reduction in decreases in the machining speed.

Figure 4:
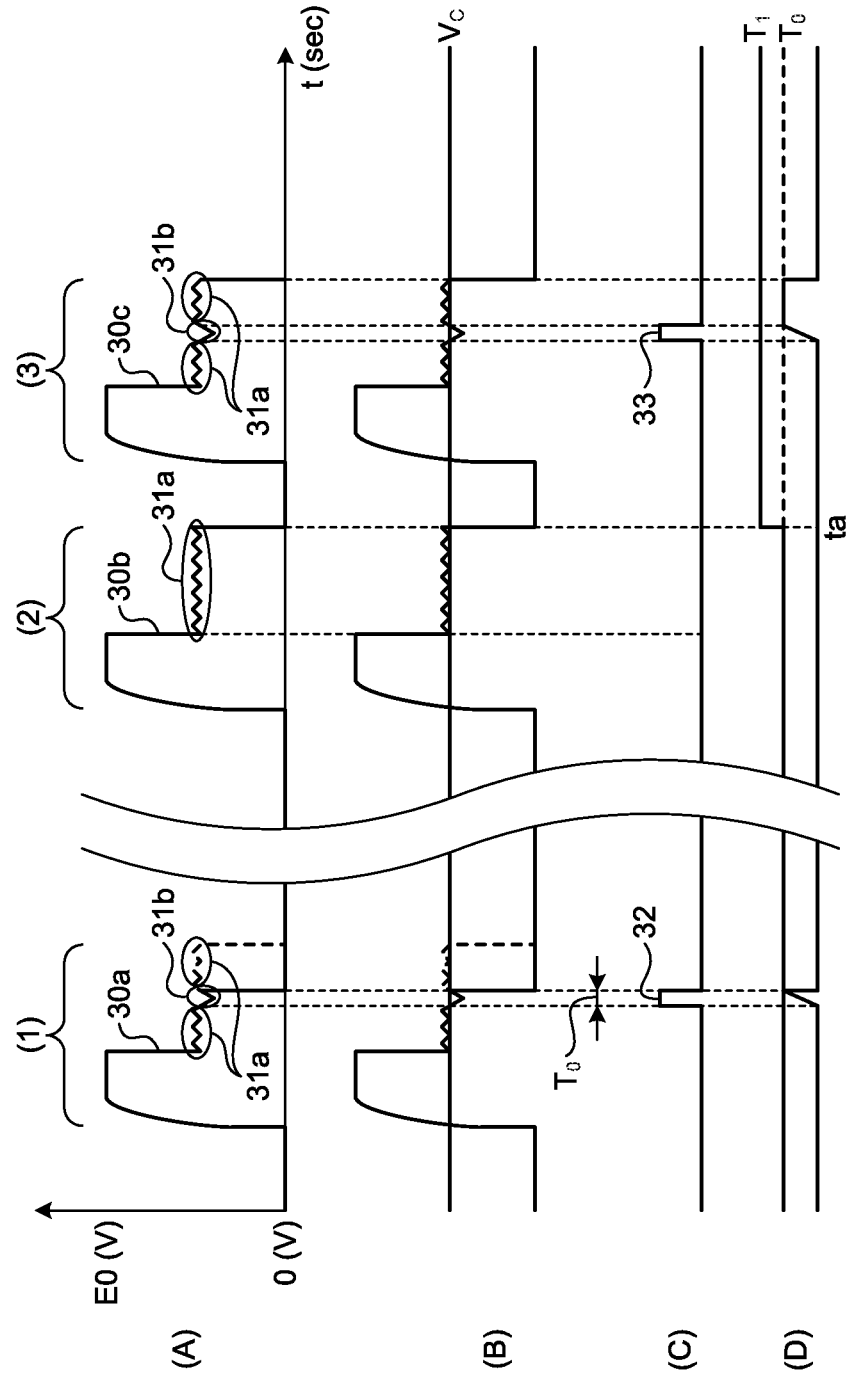
FIG. 4 is a chart illustrating an example of the respective signals in the power supply control apparatus according to the first embodiment.

FIG. 4 is a chart illustrating an example of the respective signals in the power supply control apparatus 100 according to the present embodiment. FIG. 4 illustrates an example of the respective signals in the power supply control apparatus 100 in a case where determination is performed in the mode A.

In FIG. 4, the abscissa axis indicates time. (A) of FIG. 4 illustrates an example of the voltage in the machining gap, and (B) of FIG. 4 illustrates an example of the voltage level detected by the voltage level detecting device 4. The waveforms indicated by dashed lines in (A) and (B) of FIG. 4 indicate the waveforms that would be provided if the discharge pulse is not shut off. (C) of FIG. 4 illustrates an example of the signal output from the voltage level comparator 5. The lower row in (D) of FIG. 4 illustrates an example of the cumulative time calculated by the determining unit 7. The upper row in (D) of FIG. 4 illustrates the value of the reference determination time $T_R$ set in the determining unit 7. In the example illustrated in FIG. 4, the reference determination time $T_R$ is initially set to $T_0$, and, at a time ta, the reference determination time $T_R$ is changed to $T_1$, which is greater than $T_0$.

In FIG. 4, the respective signals in three kinds of discharge states (1) through (3) are illustrated. Voltage drops 30a, 30b, and 30c indicate that the voltage in the machining gap drops to a predetermined discharge voltage level after application of the machining voltage. When the discharge voltage drops to the predetermined discharge voltage level, machining discharge starts. In a normal state, after machining discharge starts, discharge is performed during the machining discharge time. A normal state 31a indicates a state in which the voltage in the machining gap is higher than the reference voltage $V_C$ after the voltage drops 30a, 30b, and 30c. An abnormal state 31b indicates a state in which the voltage in the machining gap is lower than the reference voltage $V_C$.

The discharge state (1) shows that a value from the voltage level comparator 5 switches to a value indicating abnormality in the middle of the machining discharge time, and the cumulative time reaches $T_0$. The determining unit 7 thus determines the discharge pulse to be an abnormal pulse with the result that control for shutting off a discharge pulse width shut-off is performed due to the occurrence of the abnormal discharge. The discharge state (2) shows that what is called a normal discharge is performed, that is, the discharge pulse is determined not to be an abnormal pulse in the middle of the machining discharge time. Further, the discharge state (2) shows that the reference determination time $T_R$ is changed from $T_0$ to $T_1$ at the time to following the end of the machining discharge time. The discharge state (3) shows that because the reference determination time $T_R$ has been changed to $T_1$, normal discharge is performed, even if the waveform of the voltage level detected by the voltage level detecting device 4 is similar to that in the discharge state (1) in (B) of FIG. 4.

In the discharge state (1), the voltage in the machining gap illustrated in (A) of FIG. 4 changes from the machining voltage applied to the machining gap, to the normal state 31a through the voltage drop 30a. After that, the discharge state temporarily turns into the abnormal state 31b due to voltage pulsation. This pulsation is temporary, and, if the discharge pulse is not shut off, the voltage in the machining gap would return to the normal state 31a after the abnormal state 31b. In the abnormal state 31b, the detected value of the voltage output from the voltage level detecting device 4 is a value indicating abnormality in the voltage level, as illustrated in (B) of FIG. 4. Therefore, while the output level from the voltage level detecting device 4 is lower than the reference voltage $V_C$, the signal output from the voltage level comparator 5 is in an H-level state 32 indicating abnormality.

The cumulative time calculated by the determining unit 7, that is, the cumulative time during which the output level of the voltage level comparator 5 is H level, increases during the H-level state 32, as illustrated in (D) of FIG. 4. When the cumulative time reaches $T_0$, the determining unit 7 determines the discharge pulse to be an abnormal pulse, and outputs this determination result to the discharge pulse control device 9, so that the discharge pulse control device 9 shuts off the discharge pulse. The determining unit 7 resets the cumulative time to 0 when the cumulative time reaches $T_0$.

In the discharge state (2), the voltage in the machining gap is higher than the reference voltage $V_C$ during the machining discharge time, and therefore, the discharge pulse is not shut off. As described above, the reference determination time $T_R$ is changed to $T_1$ after the machining discharge time in the discharge state (2).

Assuming that the reference determination time $T_R$ is the constant $T_0$, when a temporary voltage drop occurs due to the aforementioned pulsation, the discharge pulse is determined to be an abnormal pulse as illustrated in the discharge state (1). As a result, the discharge pulse is shut off. On the other hand, the discharge state (3) after the reference determination time $T_R$ has been changed to $T_1$ shows that although the signal output from the voltage level comparator 5 becomes an H-level state 33 indicating abnormality as a result of a voltage drop due to pulsation similar to that in the discharge state (1), the output level from the voltage level detecting device 4 returns to a higher level than the reference voltage $V_C$ before the cumulative time reaches the $T_1$. As a result, the cumulative time stops increasing. Because the cumulative time does not reach $T_1$, therefore, the discharge pulse is not shut off. In the present embodiment, the reference determination time $T_R$ is variable. Thus, for example, in a case where a normal discharge state continues for a certain period of time, the reference determination time $T_R$ is changed from $T_0$ to $T_1$ by an input from the user, thereby preventing discharge pulse from being shut off.

Figure 5:
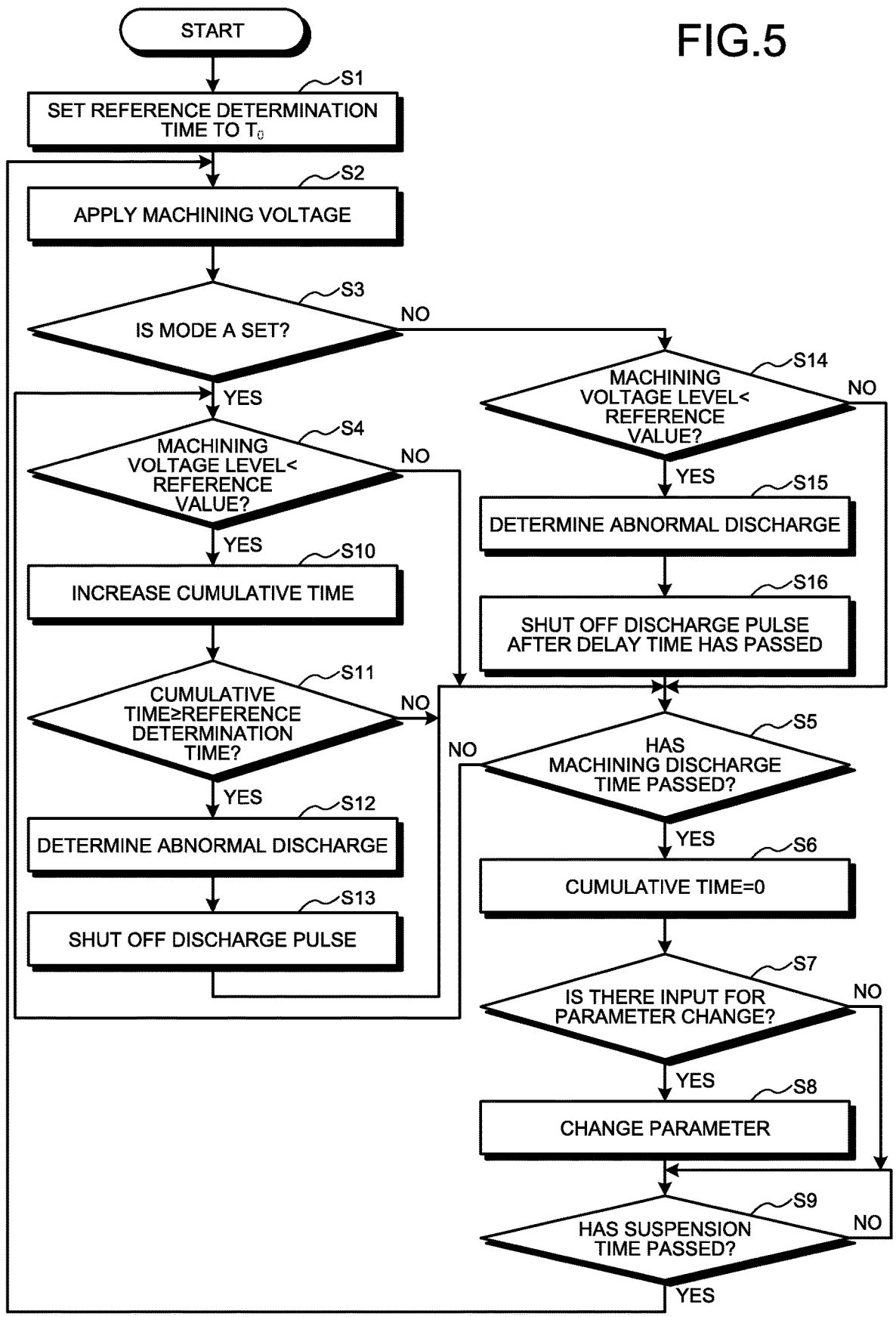
FIG. 5 is a flowchart illustrating an example operation in the power supply control apparatus according to the first embodiment.

FIG. 5 is a flowchart illustrating an example operation in the power supply control apparatus 100 according to the present embodiment. Although an example of determination in the mode A has been described with reference to FIG. 4, an overall operation in the power supply control apparatus 100 is now described with reference to FIG. 5. First, the determining unit 7 sets parameters for determination to initial values (step S1). The parameters include information indicating which one of the two modes, the mode A and the mode B, is to be used. In a case where the mode A is designated as a parameter of an initial value, the parameters set as the initial values include the reference determination time. In a case where the mode B is designated as a parameter of an initial value, the parameters set as the initial values include the delay time.

The machining power supply 1 applies the machining voltage to the machining gap, under the control of the discharge pulse control device 9 (step S2). In a case where the determination method is set to the mode A (step S3: Yes), the determining unit 7 determines whether the machining voltage level is lower than the reference value, on the basis of the signal output from the voltage level comparator 5 (step S4). When the machining voltage level is not lower than the reference value (step S4: No), the determining unit 7 determines whether the machining discharge time has elapsed since the start of machining discharge (step S5). Note that the determining unit 7 may determine the start of machining discharge when a certain time has elapsed after the application of the machining voltage, or may determine the start of machining discharge when the voltage value detected by the voltage level detecting device 4 becomes equal to or lower than a prescribed value. The method for determining the start of machining discharge may be selectively used depending on the details of the machining and the like.

When the machining discharge time has not elapsed since the start of machining discharge (step S5: No), the determining unit 7 returns to step S4. When the machining discharge time has elapsed since the start of machining discharge (step S5: Yes), the cumulative time is reset to 0 (step S6), and the determining unit 7 determines whether there is a parameter change input (step S7). Specifically, in step S7, the determining unit 7 determines whether setting information has been input from the determination setting device 8 to the determining unit 7. When there is a parameter change input (step S7: Yes), the determining unit 7 changes a parameter on the basis of the input parameter, that is, the parameter indicated by the setting information (step S8). When there is no parameter change input (step S7: No), the process proceeds to step S9. Note that, although the determining unit 7 can receive setting information from the determination setting device 8 at any appropriate time, the example described herein is based on the assumption that the determining unit 7 changes the parameter at the point of time when the machining discharge time comes to an end. However, the timing to change the parameter is not limited to this example. In other words, steps S7 and S8 can be carried out at any appropriate timing.

After step S8, the discharge pulse control device 9 determines whether the suspension time has elapsed (step S9). When the suspension time has not elapsed (step S9: No), the discharge pulse control device 9 repeats step S9. When the suspension time has elapsed (step S9: Yes), the process starting from step S2 are again performed.

When the machining voltage level is lower than the reference value in step S4 (step S4: Yes), the determining unit 7 increases the cumulative time (step S10). The determining unit 7 then determines whether the cumulative time is equal to or longer than the reference determination time (step S11). When the cumulative time is shorter than the reference determination time (step S11: No), the determining unit 7 advances the process to step S5. When the cumulative time is equal to or longer than the reference determination time (step S11: Yes), the determining unit 7 determines the discharge to be abnormal discharge, that is, determines the discharge pulse to be an abnormal pulse (step S12). In step S12, the determining unit 7 further outputs, to the discharge pulse control device 9, a signal indicating the abnormal pulse determination result, and resets the cumulative time to 0. The discharge pulse control device 9 receives the signal indicating that the discharge pulse is an abnormal pulse, and shuts off the discharge pulse (step S13). After step S13, the process proceeds to step S5.

When the determination mode is not set to the mode A in step S3, that is, when the mode is set to the mode B (step S3: No), on the other hand, the determining unit 7 determines whether the machining voltage level is lower than the reference value (step S14). When the machining voltage level is lower than the reference value (step S14: Yes), the determining unit 7 immediately determines in the mode B the discharge to be abnormal discharge, that is, the discharge pulse to be an abnormal pulse (step S15). After the delay time $T_d$ has elapsed, the discharge pulse is shut off (step S16). Specifically, in step S16, after the delay time $T_d$ has elapsed, a determination result indicating that the discharge pulse is determined to be an abnormal pulse is output to the discharge pulse control device 9, and the discharge pulse is shut off by the discharge pulse control device 9. After step S16, the process proceeds to step S5. When the machining voltage level is not lower than the reference value (step S14: No), the process proceeds to step S5. Note that, when the mode B is selected, the process in step S6 may be skipped.

Figure 6:
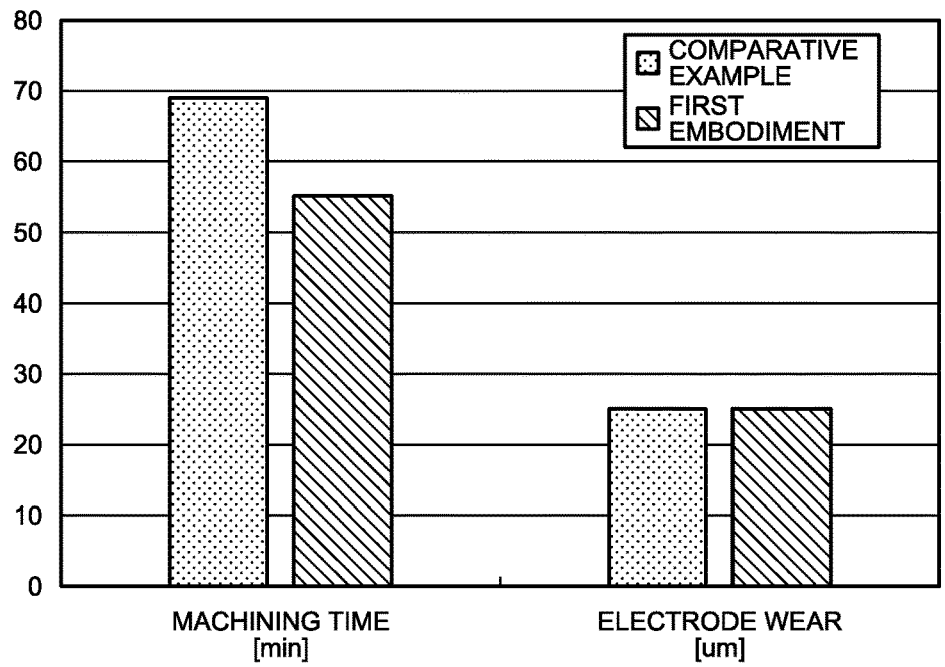
FIG. 6 is a machining characteristics diagram illustrating machining performance according to the first embodiment as compared with a comparative example.

Next, the effects of the present embodiment are described through specific examples. FIG. 6 is a machining characteristics diagram illustrating the machining performance according to the first embodiment as compared with the comparative example. In FIG. 6, machining time and electrode wear are illustrated as the machining performance. On the left side in FIG. 6, the ordinate axis indicates the machining time (min). On the right side in FIG. 6, the ordinate axis indicates the electrode wear near the tip of the machining electrode 2, or the amount of wear (μm) of a side surface of the machining electrode 2. In each of the graph of the machining time and the electrode wear in FIG. 6, the left bar indicates the machining performance according to the comparative example, and the right bar indicates the machining performance according to the first embodiment. In the comparative example, the pulse is shut off when the machining voltage level becomes lower than the reference value.

The example of FIG. 6 illustrates the machining characteristics observed in a case where electric discharge machining is performed with a machining depth of 20 mm. In the example illustrated in FIG. 6, the machining electrode 2 is 15 mm square graphite, the workpiece 3 is steel, and the liquid treatment is jet-free. The machining conditions include a peak current value of 80 A, a pulse width or a machining discharge time of 256 μs, and a suspension time of 128 μs.

For the machining performance according to the first embodiment, the electrode wear is equivalent to that in the comparative example, but the machining time is shorter than that in the comparative example, as illustrated in FIG. 6. As described above, according to the first embodiment, the discharge pulse is shut off in a case where the cumulative time during which the machining voltage level is lower than the reference voltage is equal to or longer than the reference determination time. Alternatively, the discharge pulse is shut off after the lapse of the delay time after the machining voltage level became lower than the reference value. Shutting off the discharge pulse according to the first embodiment can reduce the influence of abnormal pulses, and also reduce the decrease in the machining speed as compared with shutting off the pulse when the machining voltage level becomes lower than the reference value. Further, the parameters to be used in determining whether the discharge pulse is an abnormal pulse are variable. This enables the more appropriate setting of the parameter. Setting the parameters appropriately can reduce occurrence of abnormal discharge in the machining gap, thereby preventing damage to the machining electrode 2 and the workpiece 3. Additionally, setting the parameters appropriately can prevent formation of granular protrusions such as adhesion of carbide, and also accurately shut off the discharge pulse without excessively shutting off the discharge pulse, thereby improving the machining speed.

Further, in a case where the discharge pulse is shut off when the cumulative time is equal to or longer than the reference determination time, it is possible accurately identify the decrease in the discharge voltage level due to abnormal discharge and the decrease in the discharge voltage level due to voltage pulsation or the like caused by noise. This makes it possible to prevent the discharge pulse from being unnecessarily shut off.

Further, in the present embodiment, the determination mode, the reference determination time, the delay time, and the like can be changed during the machining. Accordingly, in the present embodiment, it is possible to change the reference determination time, the delay time, and the like, in accordance with machining circumstances. The machining circumstances, which are uncontrollable factors affecting machining results, include, for example, a state of machining debris remaining in the machining gap, variation among machining devices, and the like. As the user changes the determination mode, the reference determination time, the delay time, and the like during the machining in accordance with the machining circumstances, it is less likely that the discharge pulse is unnecessarily shut off and abnormal discharge in the machining gap occurs.

Although, in the present embodiment, the determination mode, the reference determination time, and the delay time can be changed by inputs, the determination mode, the reference determination time, and the delay time may be provided as follows:

(1) Only the mode A is used as the determination mode, and the reference determination time can be changed.

(2) Only the mode B is used as the determination mode, and the delay time can be changed.

(3) The reference determination time and the delay time are constant values, and the determination mode can be changed.

The change to the reference determination time with the mode A designated can be considered another kind of change to the determination mode. Namely, determinations in the mode A with different reference determination times can be considered different determination modes. Likewise, the change to the delay time during the determination in the mode B can be considered a change to the determination mode. In options (1) and (2) above, the determining unit 7 is adaptable to a plurality of determination modes, and can make the determination in the designated one of the plurality of determination mode. That is, the plurality of determination modes includes a plurality of determination methods with the different reference determination times in the first determination mode, and a plurality of determination modes with the different delay times in the second determination mode.

In the above example, one of the two determination modes can be designated. Alternatively, three or more determination modes may be provided, in which case one of the three or more determination modes can be designated. For example, in addition to the above two modes, a further determination mode for determining whether a discharge pulse is an abnormal pulse on the basis of a result of comparison between a high-frequency component and a reference voltage Vref, as disclosed in Patent Literature 1, may be provided. In this case, one of the three determination modes can be designated. In the further determination mode, the discharge pulse is not be shut off immediately when abnormality is determined through comparison between the high-frequency component and the reference voltage Vref, but the discharge pulse may be shut off when the cumulative time during which abnormality is determined becomes equal to or longer than the reference determination time as described above. That is, the plurality of determination methods may include a third determination mode for determining whether the discharge pulse is abnormal, on the basis of a cumulative time during which the high-frequency component to be superimposed on the discharge voltage is smaller than a high-frequency component reference value. The reference determination time in this case may also be variable.

Note that the reference voltage $V_C$ can also be input by the determination setting device 8, and the reference voltage $V_C$ may be variable.

Second Embodiment

Figure 7:
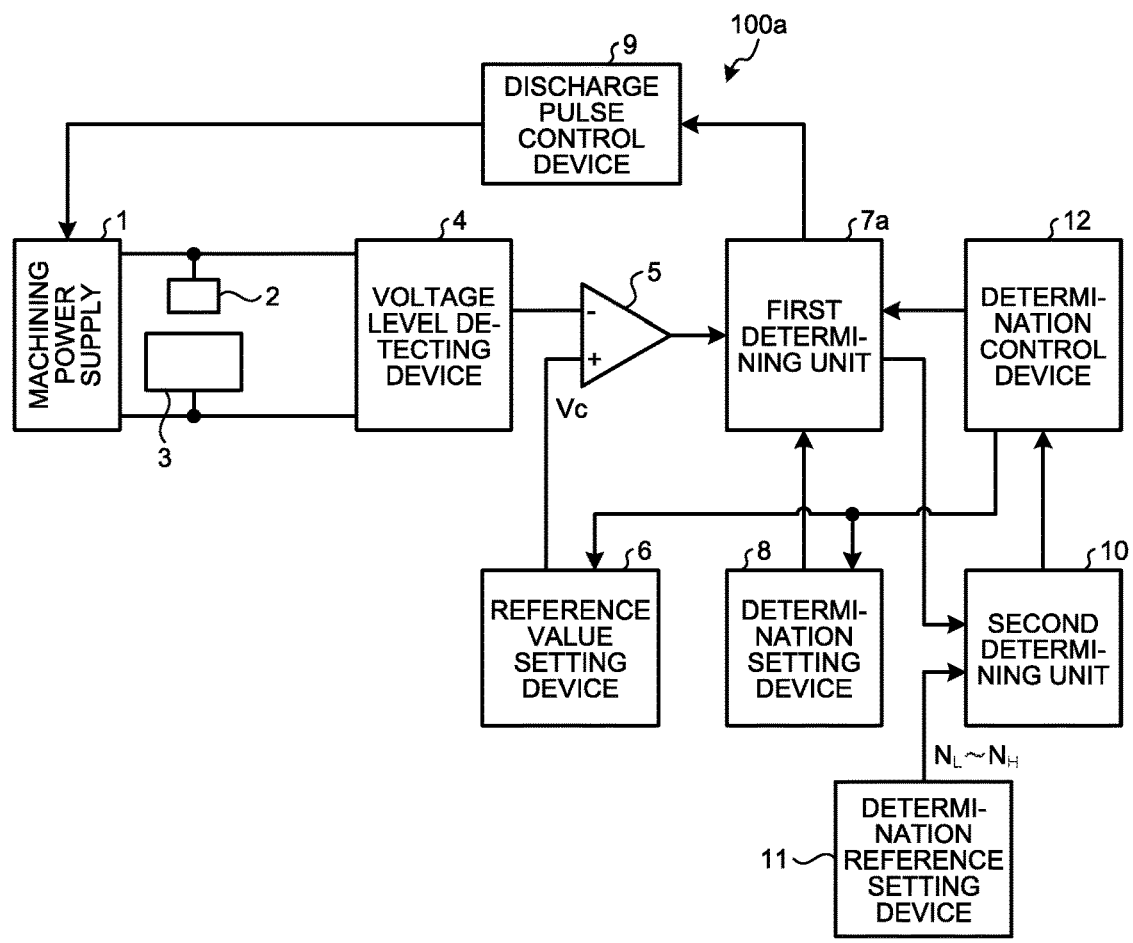
FIG. 7 is a diagram illustrating an example configuration of a power supply control apparatus of an electric discharge machine according to a second embodiment.

FIG. 7 is a diagram illustrating an example configuration of a power supply control apparatus of an electric discharge machine according to a second embodiment of the present invention. A power supply control apparatus 100a of the second embodiment is the same as the power supply control apparatus 100 of the first embodiment, except for further including a second determining unit 10, a determination reference setting device 11, and a determination control device 12, and including a first determining unit 7a in place of the determining unit 7. The components having the same functions as those in the first embodiment are denoted by the same reference numerals as those in the first embodiment, and duplicated explanation thereof is omitted. In the description below, the different aspects from the first embodiment are mainly explained.

Like the determining unit 7 of the first embodiment, the first determining unit 7a determines whether the discharge pulse is an abnormal pulse, on the basis of a signal output from the voltage level comparator 5, and outputs the determination result to the discharge pulse control device 9. The first determining unit 7a further counts the number of abnormal pulses within a prescribed time, and outputs the number of abnormal pulses in the prescribed time to the second determining unit 10. The first determining unit 7a also sets the respective parameters for use in determination, on the basis of setting information from the determination setting device.

The determination reference setting device 11 can receive an input of a lower limit value $N_L$ and an upper limit value $N_H$. The lower limit value $N_L$ and the upper limit value $N_H$ define the reference range for determining whether the number of abnormal pulses in the prescribed time is appropriate. The determination reference setting device 11 outputs the lower limit value $N_L$ and the upper limit value $N_H$ to the second determining unit 10. On the basis of the number of abnormal pulses in the prescribed time input from the first determining unit 7a, and the lower limit value $N_L$ and the upper limit value $N_H$ input from the determination reference setting device 11, the second determining unit 10 determines whether the settings related to abnormal pulse determination are appropriate, and outputs the determination result to the determination control device 12. In other words, the determination reference setting device 11 is a setting determining unit that determines whether the designated determination mode is appropriate, on the basis of the number of discharge pulses determined to be abnormal in the prescribed time. The settings related to abnormal pulse determination are the settings of the respective items that can be set as the respective parameters described in the first embodiment, and may include the setting of the reference voltage.

Specifically, when the number of abnormal pulses in the prescribed time falls within the reference range between the lower limit value $N_L$ and the upper limit value $N_H$, the second determining unit 10 determines that the settings related to abnormal pulse determination are appropriate. When the number of abnormal pulses in the prescribed time does not fall within the reference range between the lower limit value $N_L$ and the upper limit value $N_H$, the second determining unit 10 determines that the settings related to abnormal pulse determination are not appropriate. When the second determining unit 10 determines that the settings related to abnormal pulse determination are not appropriate, the second determining unit 10 also outputs, to the determination control device 12, a determination result that is information indicating that the number of abnormal pulses in the prescribed time is smaller than the lower limit value $N_L$, or that the number of abnormal pulses in the prescribed time exceeds the upper limit value $N_H$.

The determination control device 12 monitors the determination result output from the second determining unit 10 in each prescribed time. When the determination result indicates that the settings are appropriate, the determination control device 12 performs control such that maintain the current settings are maintained, that is, the determination control device 12 does not change the current settings. The determination control device 12, which monitors the determination result output from the second determining unit 10 in each prescribed time, instructs the first determining unit 7a to change at least one of the parameters when the determination result indicates that the settings are not appropriate. The determination control device 12 is a determination control unit that changes the designated determination mode when the designated determination mode is determined to be not appropriate on the basis of the number of discharge pulses determined to be abnormal in the prescribed time. For example, the determination control device 12 may switch the determination mode. In a case where the first determining unit 7a is performing determination in the mode A, the determination control device 12 may change the reference determination time. In a case where the first determining unit 7a is performing determination in the mode B, the determination control device 12 may change the delay time, or may change the reference voltage. Alternatively, the above processes may be performed in combination. For example, in a case where the number of abnormal pulses in the prescribed time exceeds the upper limit value $N_H$ while the first determining unit 7a is performing determination in the mode A, the determination control device 12 extends the reference determination time. This can reduce the number of abnormal pulses within the prescribed time. Note that the first determining unit 7a, for example, notifies the determination control device 12 of in which determination mode the first determining unit 7a is performing determination.

The first determining unit 7a, the second determining unit 10, the determination reference setting device 11, and the determination control device 12 of the present embodiment are implemented by a processing circuit, like the determining unit 7 and other components of the first embodiment.

Figure 8:
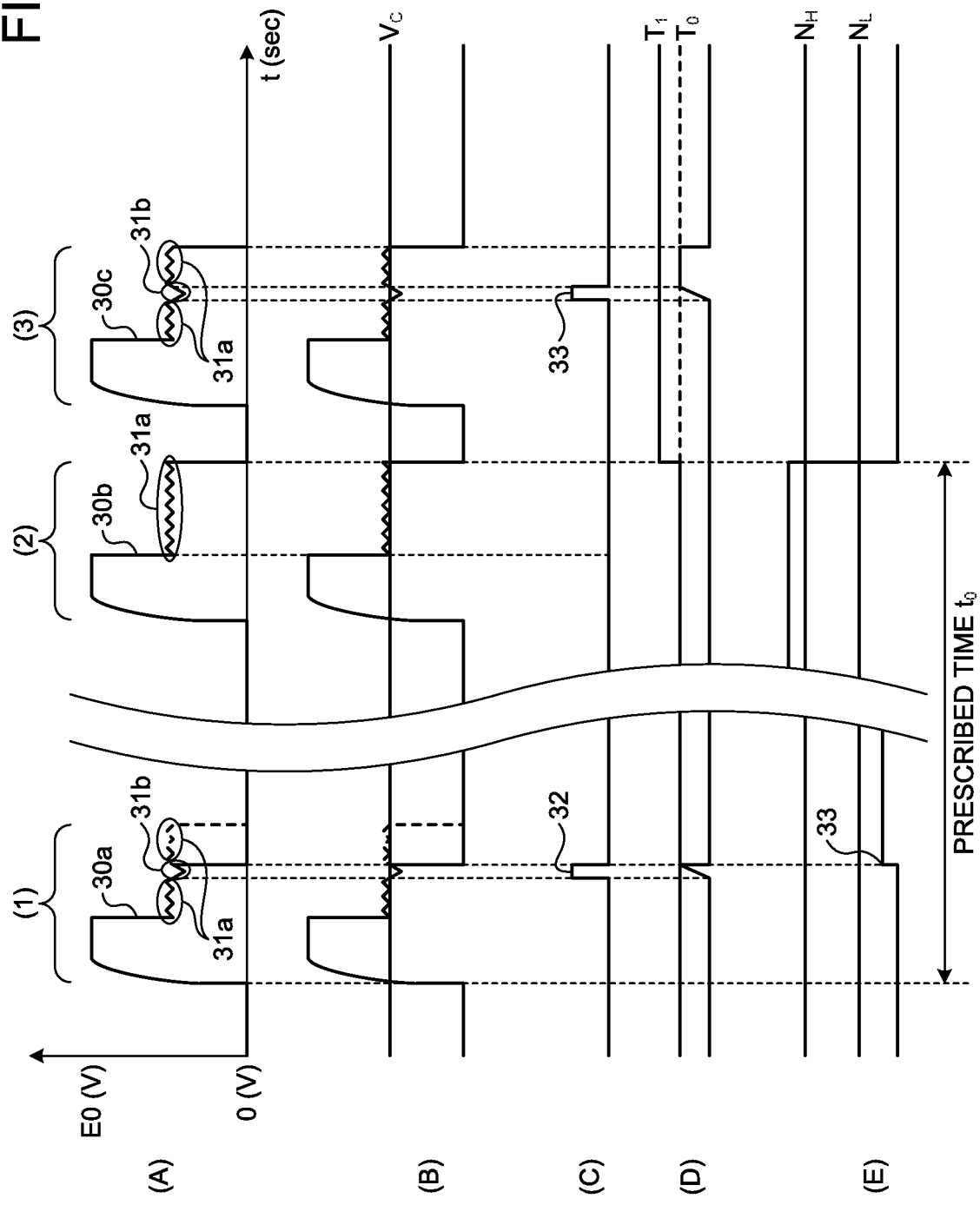
FIG. 8 is a chart illustrating an example of the respective signals in the power supply control apparatus according to the second embodiment.

Next, operation according to the present embodiment is described. FIG. 8 is a chart illustrating an example of the respective signals in the power supply control apparatus 100a according to the present embodiment. FIG. 8 illustrates an example of the respective signals in the power supply control apparatus 100a in a case where determination is performed in the mode A. (A) through (D) in FIG. 8 are the same as (A) through (D) in FIG. 4 described in the first embodiment. (E) of FIG. 8 illustrates the number of abnormal pulses counted by the first determining unit 7a in a prescribed time $t_0$.

In the first embodiment, the reference determination time is changed from $T_0$ to $T_1$ by an input from the user or the like. However, to change a parameter with an input from the user, the operator or the machining condition creator, who is the user, needs to appropriately select a determining unit and a determination reference in accordance with the machining conditions, and therefore, the user is required to have a sufficiently high degree of skill. In view of this, the power supply control apparatus 100a of the second embodiment changes a parameter when the second determining unit 10 determines that the number of abnormal pulses counted by the first determining unit 7a in the prescribed time $t_0$ does not fall within the reference range. In the example illustrated in FIG. 8, the number of abnormal pulses counted by the first determining unit 7a in the prescribed time $t_0$ is outside the reference range at the end of the prescribed time $t_0$. Therefore, the second determining unit 10 outputs, to the determination control device 12, a determination result indicating that the setting is not appropriate and the number of abnormal pulses exceeds the upper limit value $N_H$ of the reference range. In the example illustrated in FIG. 8, the determination control device 12 extends the reference determination time from $T_0$ to $T_1$ accordingly. As a result, in the discharge state (3), the discharge pulse is not determined to be an abnormal pulse, and thus the discharge pulse is not shut off, as in the first embodiment.

Figure 9:
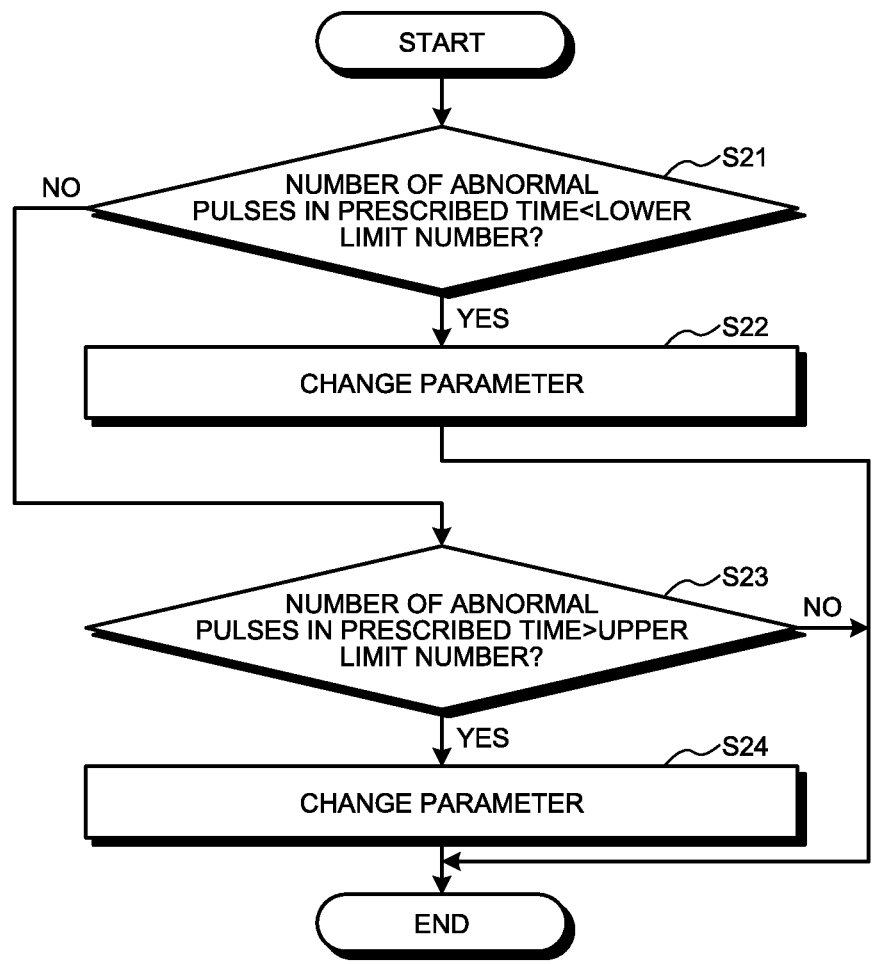
FIG. 9 is a flowchart illustrating an example of processing procedures in a determination control device according to the second embodiment.

FIG. 9 is a flowchart illustrating an example of processing procedures in the determination control device 12 according to the second embodiment. On the basis of the determination result output from the second determining unit 10, the determination control device 12 determines whether the number of abnormal pulses in the prescribed time is smaller than the lower limit value (step S21). When the number of abnormal pulses in the prescribed time is smaller than the lower limit value (step S21: Yes), the determination control device 12 changes the parameter (step S22), and the process then comes to an end. When the number of abnormal pulses in the prescribed time is not smaller than the lower limit value (step S21: No), the determination control device 12 determines whether the number of abnormal pulses in the prescribed time exceeds the upper limit value (step S23). When the number of abnormal pulses in the prescribed time exceeds the upper limit value (step S23: Yes), the determination control device 12 changes the parameter (step S24), and the process then comes to an end. When the number of abnormal pulses in the prescribed time does not exceed the upper limit value (step S23: No), the process comes to an end.

Settings may be predetermined as to which and how parameter should be changed by the determination control device 12 when the number of abnormal pulses in the prescribed time is outside the reference range. In particular, such settings may be predetermined in each of cases where the number of abnormal pulses exceeds the upper limit value and where the number of abnormal pulses is smaller than the lower limit value. Alternatively, the determination setting device 8 may receive inputs about these settings from the user, and output the received settings to the determination control device 12.

As described above, according to the second embodiment, it is possible to appropriately set parameters related to determination as to whether the discharge pulse is an abnormal pulse, irrespective of the level of skill of the operator or the machining condition creator. Accordingly, it is possible to reduce occurrence of abnormal discharge in the machining gap, thereby preventing damage to the machining electrode 2 and the workpiece 3, irrespective of the level of skill of the worker or the machining condition creator. Furthermore, it is possible to not only prevent formation of granular protrusions such as adhesion of carbide, but also accurately shut off the discharge pulse without shutting off the discharge pulse excessively, thereby improving the machining speed.

In the second embodiment, the determination mode can also be switched between the mode A and the mode B, as in the first embodiment. For example, when the number of abnormal pulses in the prescribed time exceeds the upper limit value $N_H$ during performance of the determination by the first determining unit 7a in the mode B, the number of abnormal pulses does not basically change even if the delay time is changed. Therefore, the second determining unit 10 determines that the number of abnormal pulses does not fall within the reference range of $N_L$ to $N_H$. In such a case, the determination mode is switched from the mode B to the mode A, with the result that the second determining unit 10 may perform control such that the number of abnormal pulses falls within the reference range of $N_L$ to $N_H$. Note that any method may be used as the method of switching determination modes, and the above described example method is not necessarily used.

Third Embodiment

Figure 10:
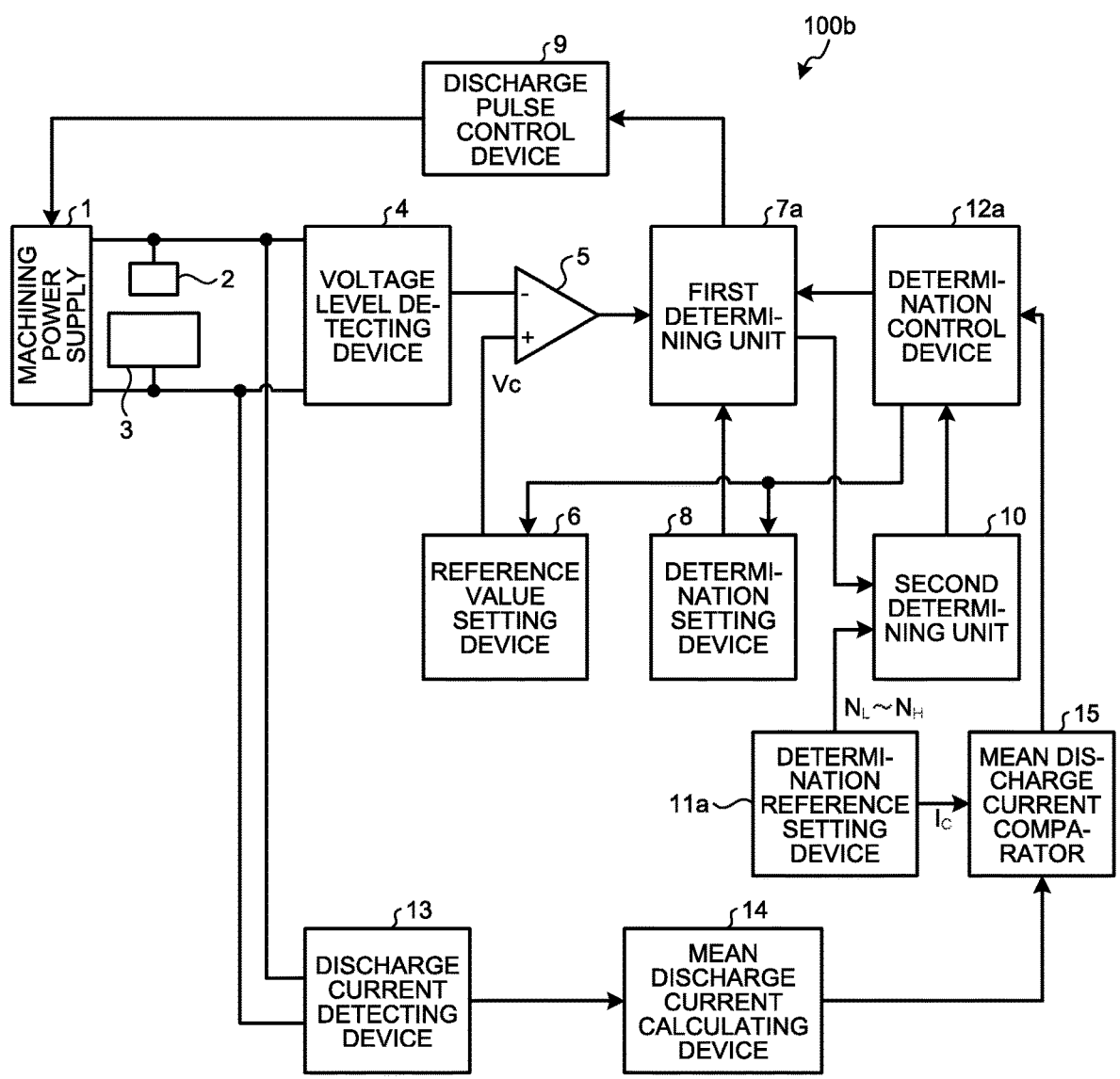
FIG. 10 is a diagram illustrating an example configuration of a power supply control apparatus of an electric discharge machine according to a third embodiment.

FIG. 10 is a diagram illustrating an example configuration of a power supply control apparatus of an electric discharge machine according to a third embodiment of the present invention. A power supply control apparatus 100b of the third embodiment is the same as the power supply control apparatus 100a of the second embodiment, except for further including a discharge current detecting device 13, a mean discharge current calculating device 14, and a mean discharge current comparator 15, and including a determination reference setting device 11a and a determination control device 12a in place of the determination reference setting device 11 and the determination control device 12. The components having the same functions as those in the second embodiment are denoted by the same reference numerals as those in the second embodiment, and duplicated explanation thereof is omitted. In the description below, the different aspects from the second embodiment are mainly explained.

The discharge current detecting device 13 detects the discharge current value in the machining gap during performance of machining discharge. In other words, the discharge current detecting device 13 is a discharge current detecting unit that detects the discharge current in the machining gap. The mean discharge current calculating device 14 calculates the mean current value in a prescribed time $t_f$ on the basis of the discharge current value output from the discharge current detecting device 13, and outputs the calculated mean current value to the mean discharge current comparator 15. In other words, the mean discharge current calculating device 14 is a mean discharge current calculating unit that calculates the mean value of the discharge current. The mean discharge current comparator 15 compares the mean discharge current value output from the mean discharge current calculating device 14 with a reference mean current value $I_C$ output from the determination reference setting device 11a, and outputs the comparison result to the determination control device 12a. That is, the mean discharge current comparator 15 compares a mean value with a mean discharge current reference value.

The determination reference setting device 11a has the same functions as those of the determination reference setting device 11 of the second embodiment. The determination reference setting device 11a further receives an input of the reference mean current value $I_C$, and outputs the reference mean current value $I_C$ to the mean discharge current comparator 15. On the basis of the determination result input from the second determining unit 10 and the comparison result output from the mean discharge current comparator 15, the determination control device 12a determines whether the settings in abnormal pulse determination are appropriate, and controls the first determining unit 7a on the basis of the determination result. That is, the determination control device 12a determines whether the designated determination mode is appropriate on the basis of the comparison result output from the mean discharge current comparator 15.

The determination control device 12a can perform control using two results. For example, the determination control device 12a changes the settings in the first determining unit 7a when the determination result input from the second determining unit 10 indicates that the settings are appropriate but the comparison result output from the mean discharge current comparator 15 indicates that the mean discharge current value is smaller than the reference mean current value $I_C$. Conversely, when the determination result input from the second determining unit 10 and/or the comparison result output from the mean discharge current comparator 15 indicates that the settings are appropriate, the determination control device 12a may perform control such that the settings in the first determining unit 7a are not changed.

The determination reference setting device 11a, the determination control device 12a, the discharge current detecting device 13, the mean discharge current calculating device 14, and the mean discharge current comparator 15 are implemented by a processing circuit, like the determination reference setting device 11 and the determination control device 12 of the second embodiment. As for the processing circuit for implementing the discharge current detecting device 13, a current detecting circuit including a resistor and the like can be used.

Although the third embodiment has been described as to an example in which another reference is set in addition to the determination result output from the second determining unit 10, yet another reference may be set and the settings in the first determining unit 7a may be controlled using these references.

The third embodiment has been described as to an example in which the determination control device 12a controls the settings in the first determining unit 7a, on the basis of the determination result input from the second determining unit 10 and the comparison result input from the mean discharge current comparator 15. Alternatively, the determination control device 12a may control the settings in the first determining unit 7a, on the basis of only the comparison result input from the mean discharge current comparator 15.

The configuration described in the above embodiments shows one example of the contents of the present invention and may be combined with another known technique, and it is possible to omit or modify part of the configuration, without departing from the scope of the present invention.

REFERENCE SIGNS LIST 1 machining power supply; 2 machining electrode; 3 workpiece; 4 voltage level detecting device; 5 voltage level comparator; 6 reference value setting device; 7 determining unit; 7a first determining unit; 8 determination setting device; 9 discharge pulse control device; 10 second determining unit; 11, 11a determination reference setting device; 12, 12a determination control device; 13 discharge current detecting device; 14 mean discharge current calculating device; 15 mean discharge current comparator; 100, 100a, 100b power supply control apparatus.

The invention claimed is:
1. A power supply control apparatus of an electric discharge machine, the power supply control apparatus controlling pulse discharge occurring in a machining gap in the electric discharge machine,
the power supply control apparatus comprising:
a processing circuit, including at least one of a digital circuit, an analog circuit, a processor, an application specific integrated circuit, and a field programmable gate array, configured to perform as a voltage level detector to detect a voltage level of a currently occurring discharge pulse generated in the machining gap;
a voltage level comparator including a reference value setter and configured to compare the voltage level of the currently occurring discharge pulse with a voltage level reference value set by the reference value setter, and output a comparison result; and
the processing circuit further configured to set a reference determination time, and perform as a determiner to, on a basis of whether the comparison result indicates the currently occurring discharge pulse is lower than the voltage level reference value set by the reference value setter for longer than the reference determination time, determine whether the currently occurring discharge pulse is abnormal, in a designated one of a plurality of determination modes,
wherein the designated one of the plurality of determination modes is capable of being designated during machining, and wherein the plurality of determination modes includes a determination mode for controlling a duration of the currently occurring discharge pulse determined to be abnormal by shutting off the currently occurring discharge pulse determined to be abnormal after a lapse of a delay time after the voltage level of the currently occurring discharge pulse becomes lower than the voltage level reference value.

2. The power supply control apparatus of the electric discharge machine according to claim 1, wherein the plurality of determination modes includes a first determination mode for determining whether the currently occurring discharge pulse is abnormal, on the basis of a cumulative time during which the voltage level is lower than the voltage level reference value.

3. The power supply control apparatus of the electric discharge machine according to claim 2, wherein,
when the processing circuitry performs as the determiner in the first determination mode, the determiner determines the currently occurring discharge pulse to be abnormal when the cumulative time is equal to or longer than a reference determination time, and
the plurality of determination modes include different reference determination times in the first determination mode.

4. The power supply control apparatus of the electric discharge machine according to claim 1, wherein the plurality of determination modes include different delay times.

5. The power supply control apparatus of the electric discharge machine according to claim 1, wherein the plurality of determination modes includes a determination mode for determining whether the currently occurring discharge pulse is abnormal, on the basis of a cumulative time during which a high-frequency component to be superimposed on the discharge voltage is smaller than a high-frequency component reference value.

6. The power supply control apparatus of the electric discharge machine according to claim 1, further comprising
the processing circuit further configured to perform as a determination setter to receive an input designating a determination mode and set the received determination mode as the designated one of the plurality of determination modes in the determiner.

7. The power supply control apparatus of the electric discharge machine according to claim 1, wherein the processing circuit is further configured to controllably set the delay time according to a received input value.

8. The power supply control apparatus according to claim 1, wherein the voltage level of the currently occurring discharge pulse detected by the voltage level detector is an instantaneous voltage level of the currently occurring discharge pulse generated in the machining gap.

9. A power supply control apparatus of an electric discharge machine, the power supply control apparatus controlling pulse discharge occurring in a machining gap in the electric discharge machine,
the power supply control apparatus comprising:
a processing circuit, including at least one of a digital circuit, an analog circuit, a processor, an application specific integrated circuit, and a field programmable gate array, configured to perform as a voltage level detector to detect a voltage level of a currently occurring discharge pulse generated in the machining gap;
a voltage level comparator to compare the voltage level of the currently occurring discharge pulse with a voltage level reference value, and output a comparison result;
the processing circuit further configured to perform as a determiner to, on a basis of the comparison result, determine whether the currently occurring discharge pulse is abnormal, in a designated one of a plurality of determination modes;
the processing circuit further configured to perform as a setting determiner to determine whether the designated one of the plurality of determination modes is appropriate, on the basis of a number of discharge pulses determined to be abnormal in a prescribed time; and
the processing circuit further configured to perform as a determination controller to change the designated determination mode, when the setting determiner determines the designated determination mode to be not appropriate, wherein
the designated one of the plurality of determination modes is capable of being designated during machining.

10. The power supply control apparatus of the electric discharge machine according to claim 9, wherein the processing circuit is further configured to perform as
a discharge current detector to detect a discharge current in the machining gap;
a mean discharge current calculator to calculate a mean value of the discharge current; and
a mean discharge current comparator to compare the mean value with a mean discharge current reference value,
wherein the determination controller determines whether the designated determination mode is appropriate on the basis of a comparison result output from the mean discharge current comparator.

11. The power supply control apparatus of the electric discharge machine according to claim 9, wherein the processing circuit is further configured to perform as a determination setter to receive an input designating a determination mode and set the received determination mode as the designated one of the plurality of determination modes in the determiner.

12. The power supply control apparatus of the electric discharge machine according to claim 9, wherein at least one of a setting of the voltage level reference value, a setting of the number of discharge pulses, and a setting of the predetermined time is associated with each of the plurality of determination modes.

13. The power supply control apparatus of the electric discharge machine according to claim 12, wherein the setting determiner determines whether the at least one of the setting of the voltage level reference value, the setting of the number of discharge pulses, and the setting of the predetermined time associated with the designated one of the plurality of determination modes is appropriate based on the number of discharge pulses determined to be abnormal in the prescribed time.

14. The power supply control apparatus of the electric discharge machine according to claim 9, wherein the determination controller changes the designated determination mode to another determination mode corresponding to at least one of a different voltage level reference value, a different prescribed time, and a different number of discharge pulses than associated with the designated determination mode.

15. The power supply control apparatus according to claim 9, wherein the voltage level of the currently occurring discharge pulse detected by the voltage level detector is an instantaneous voltage level of the currently occurring discharge pulse generated in the machining gap.

\* \* \* \* \*